United States Patent [19]

Tolhuizen

[11] Patent Number: 5,623,504
[45] Date of Patent: Apr. 22, 1997

[54] METHODS AND APPARATUS FOR ENCODING AND/OR DECODING DIGITAL DATA ELEMENTS WITH DIFFERENT DEGREES OF ERROR PROTECTION IN ACCORDANCE WITH A QUASI-PRODUCT CODE

[75] Inventor: Ludovicus M. G. M. Tolhuizen, Eindhoven, Netherlands

[73] Assignee: U.S. Philips Corporation, New York, N.Y.

[21] Appl. No.: 167,266

[22] Filed: Dec. 14, 1993

[30] Foreign Application Priority Data

Dec. 14, 1992 [EP] European Pat. Off. .............. 92203891

[51] Int. Cl.$^6$ ................................................. H03M 13/00
[52] U.S. Cl. ........................................ 371/37.4; 371/37.5
[58] Field of Search ............................... 371/37.1, 37.3, 371/37.4, 37.5, 40.1, 38.1

[56] References Cited

U.S. PATENT DOCUMENTS

| | | | |
|---|---|---|---|
| 4,680,764 | 7/1987 | Suzuki et al. | 371/40 |
| 4,747,104 | 5/1988 | Piret | 371/39 |
| 4,998,252 | 3/1991 | Suzuki et al. | 371/40.1 |
| 5,105,442 | 4/1992 | Wei | 375/39 |
| 5,214,656 | 5/1993 | Chung et al. | 371/43 |
| 5,305,352 | 4/1994 | Calderbank et al. | 375/39 |
| 5,383,204 | 1/1995 | Gibbs et al. | 371/37.5 X |
| 5,400,347 | 3/1995 | Lee | 371/37.5 |

OTHER PUBLICATIONS

Transactions of the Institute of Electronics, Information and Communication Engineers of Japan, vol. E74, No. 3, Mar. 1991, "On Asymptotic Distance Ratios for the Constructive Concatenated Codes with Unequal Error Protection".

Granström, K. et al; "Unequal Error Protection Codes"; IEEE, 1988.

Chung, H.; "Unequal Error Protection of Data Using Trellis–Coded Modulation"; IEEE; 1992.

*Primary Examiner*—Roy N. Envall, Jr.
*Assistant Examiner*—Brian C. Oakes
*Attorney, Agent, or Firm*—Richard A. Weiss

[57] ABSTRACT

Methods and apparatus for encoding and/or decoding digital data elements of a uniform size with different degrees of error protection in accordance with a quasi-product code. The data elements are encoded by (a) distributing the data elements over an array of at least two dimensions, made up of lines in each of the at least two dimensions, so that at least two lines in a first one of the dimensions have a different number of data elements therein; (b) supplementing the data elements in the first one of the dimensions with first redundant elements of the uniform size in accordance with one or more first systematic codes so that all lines in that dimension containing one or more data elements therein have the same number of elements therein and each of those lines contains at least one separate first redundant element therein providing error protection to that line; and (c) supplementing the data elements and the first redundant elements in a second one of the dimensions with second redundant elements of the uniform size in accordance with one or more second systematic codes so that all lines in that dimension containing one or more data elements and/or first redundant elements therein have the same number of elements therein and each of those lines contains at least one separate second redundant element therein providing error protection to that line. The data elements are decoded by decoding the lines in each dimension, one dimension at a time.

13 Claims, 1 Drawing Sheet

| D00 | D01 | D02 | D03 | D04 | D05 | D06 | D07 | D08 | D09 | D0A | D0B | D0C | Q00 | Q01 | Q02 |
|---|---|---|---|---|---|---|---|---|---|---|---|---|---|---|---|
| D10 | | | | | | | | | | | D1B | D1C | Q10 | Q12 | Q13 |
| D20 | | | | | | | | | | | | D2C | Q20 | Q21 | Q22 |
| D30 | | | | | | | | | | | | | Q30 | Q31 | Q32 |
| D40 | | | | | | | | | | | | | Q40 | Q41 | Q42 |
| D50 | | | | | | | | | | | | | Q50 | Q51 | Q52 |
| D60 | | | | | | | | | | D6A | | | Q60 | Q61 | Q62 |
| D70 | D71 | D72 | D73 | D74 | D75 | | | | | | D7B | D7C | Q70 | Q71 | Q72 |
| P30 | P31 | P32 | P33 | P34 | D85 | | | | | | | D8C | Q80 | Q81 | Q82 |
| P20 | P21 | P22 | P23 | P24 | D95 | D96 | D97 | D98 | D99 | D9A | D9B | D9C | Q90 | Q91 | Q92 |
| P10 | P11 | P12 | P13 | P14 | P15 | P16 | P17 | P18 | P19 | P1A | P1B | P1C | QA0 | QA1 | QA2 |
| P00 | P01 | P02 | P03 | P04 | P05 | P06 | P07 | P08 | P09 | P0A | P0B | P0C | QB0 | QB1 | QB2 |

METHODS AND APPARATUS FOR ENCODING AND/OR DECODING DIGITAL DATA ELEMENTS WITH DIFFERENT DEGREES OF ERROR PROTECTION IN ACCORDANCE WITH A QUASI-PRODUCT CODE

BACKGROUND OF THE INVENTION

The invention relates to a method for encoding digital data with at least two different degrees of error protection. That method comprises distributing uniform size user elements of the data over an array of at least two dimensions, supplementing according to at least one of the dimensions the user elements with first redundant elements of the uniform size of a first linear coding, and supplementing according to at least a second one of the dimensions the user elements and first redundant elements with second redundant elements of the uniform size of a second linear coding.

Such a method has been described in U.S. Pat. No. 4,680,764, which shows the error protection format of the so-called third layer in Compact Disc Read Only Memory, CD-ROM for short. The code is a pseudo-product code because the second redundant elements are not protected by the first error protective code. This means that the degree of error protection of the second redundant elements is less than the degree of error protection for either the user elements or the first redundant elements.

It has been found that often certain user elements have a higher importance than certain others, i.e., any interference of the former would cause relatively more damage than of the latter. For example, computer data is more vulnerable than audio, because errors in audio can be concealed, such as through interpolation that is useless for computer data. Also, audio is more vulnerable than video, because the human eye is more forgiving than the human ear. Also, among information of a single category, certain elements could warrant extra protective measures above those taken for other user elements. An example of elements justifying such extra protective measures would for example be intensity scaling factors of a video picture. The present invention therefore, carries the principle of different degrees of error protection to the user elements, and as such, scrupulously applies an input-output analysis of using greater redundancy versus realizing enhanced protection.

SUMMARY OF THE INVENTION

It is, inter alia, an object of the present invention to provide a method according to the first paragraph of the Background of the Invention that allows for straightforward encoding with respective different levels of error protection, while allowing easy selection of the user elements that deserve the lower, or the higher, degree of error protection, respectively. According to one of its aspects, the invention is characterized in that the first linear coding for at least one first line of user elements realizes a higher degree of error protection than for at least one second line of user elements. The former is realized as a first code that has more of the first redundant elements than the latter which is realized as a second code.

A particular advantage of an array-wise organization is its simplicity. Various codings may be organized as a series of parallel-occurring multi-symbol code words, wherein the symbols may have one bit each, or preferably have an organization that is suitable for data processing, such as based on 8-bit bytes or any other suitable format.

Advantageously, all code words of the first coding have a first uniform size, and all code words of the second coding have a second uniform size. This is a positive aspect, especially for intermediate storage of received data in a memory, and also for easy control of interleaving of the symbols when transported along a physical medium channel or by broadcast. Alternatively, the extra redundancy could in whole or in part lead to larger code words.

Advantageously, the higher degree of error protection is realized through a greater minimum distance. This means that the error protection, as measured in the number of erroneous user elements that can be corrected and/or detected is higher for the first code. Another solution is that the measure provides increased protection for certain error types, such as burst errors, that may, however, not be expressed as a greater minimum distance. An example of codes offering a high degree of error protection against burst codes are so-called Fire-codes.

Advantageously, the first linear coding is also arranged to protect the second redundant elements. This provides a particularly straightforward code organization.

Advantageously, the first code is a subcode of the second code. This renders the encoding and decoding simple. Much of the hardware used for one code is reusable for the other.

The invention also relates to a method for decoding user data that have been encoded according to the foregoing. By itself, decoding of multi-symbol code words is a well established art. Given a particular degree of error protection through an associated number of redundant elements, various strategies are possible, such strategies also depending on the code actually used. Advantageously, all code words of the second coding relating to the array are decoded first before enabling decoding of any code word of the first code relating to the array. This is a very straightforward way of decoding. In particular, if a second code word would contain a burst error, its decoding usually fails, but such failure could be translated to an erasure flag for the appropriate first code word to alleviate its decoding burden. By itself, error decoding technology has developed a host of decoding stratagems that could be used in any feasible measure or combination.

The invention also relates to an apparatus for implementing the methods. Further advantageous aspects are described hereinafter.

BRIEF DESCRIPTION OF THE DRAWINGS

Further aspects and advantages of the invention will become apparent through the disclosure of preferred embodiments that are also shown in and by the drawings, in which.

DESCRIPTION OF THE PREFERRED EMBODIMENTS

Figures 1, 2:
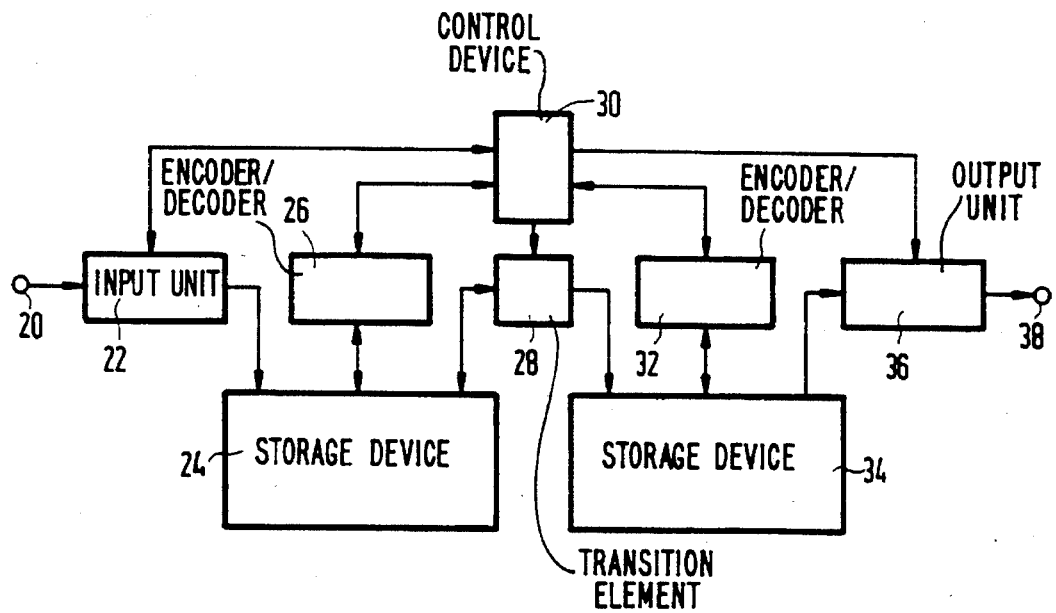
FIG. 1 shows a first format of error protective codings.
FIG. 2 is a block diagram of an encoding and/or decoding apparatus according to the invention.

FIG. 1 shows a first format of error protective codings. The data symbols (i.e. user elements), such as bytes, are arranged according to rows and columns. The upper row has 13 data symbols $D_{00} \ldots D_{0C}$, and likewise for the next seven rows. In the next two rows, there are only eight data symbols. There are four parity symbols $P_{30} \ldots P_{00}$ in the first column, and likewise for the next four columns. The next eight columns have only two parity symbols each.

An advantageous realization is that each column is encoded according to a Reed-Solomon code, wherein the code with the four parity symbols is a subcode of the two-parity symbol code. For brevity, other codes such as binary BCH codes are not considered in this example.

Generating a subcode occurs through introduction of extra zeroes into a generator polynomial. This means that a generator polynomial with a lesser number of zeroes is a factor of a polynomial with a greater number of zeroes. The subcode, as a result, has a larger distance and fewer code words.

Use of a subcode with respect to the earlier columns allows hardware which is usable for those earlier columns also to be usable for the later columns. For example, a part of the syndrome symbols for the earlier columns can be calculated by exactly the same expressions as those for the later columns. Of course, the hardware part incorporating the strategy would generally, but not necessarily, be different.

The earlier columns of FIG. 1 have a symbol-wise minimum distance of five, which would allow for two-symbol correction. The later columns have a symbol-wise minimum distance of three, which would allow for one-symbol correction.

Other usages of the protection offered by the number of parity symbols actually present are well-known in the art. The codes used need not at all be Reed-Solomon codes, but are preferably linear, which means that the sum of two correct code words again produces a correct code word. The term—correct code word—is by itself redundant in that standard art usage is—code word—; the principle of error correction is that any noncode word should be associated to a particular code word. The codes are also preferably systematic on the level of the user elements or symbols. It has been known in the art that linear codes can be made systematic through symbol permutation. On the other hand, symbol permutation on a systematic code keeps as result a linear code. Use of the exemplary Reed-Solomon codes, especially in case of the product-like codes of the envisaged format, greatly facilitates the decoding. Moreover, the degree of error protection is also easily ascertained for these codes. As mentioned earlier, the codes need not be maximum distance separable, as various other classes of codes would also produce an appropriate degree of protection.

As shown in the FIG. 1, each row also has three parity symbols, which in the case of a Reed-Solomon code would give a minimum distance of four and, therefore, would allow for a symbol-wise single error correction and double error detection. In a first embodiment, the three parity symbols cover all symbols on their own row. This leads to a quasi-product code, i.e., symbols $A_{A0}$, $A_{A1}$, $A_{A2}$, $A_{B0}$, $A_{B1}$, $A_{B2}$ would constitute parity symbols of both their respective rows and of their respective columns, thereby also giving the distance-four error protection to the rows of Q-parity symbols. A second embodiment corresponds to that referred to with respect to CD-ROM, i.e., the code words associated to the Q-parity symbols jump through the respective rows. For example, such code words could be made up of the following symbols: $Q_{52}$, $Q_{41}$, $Q_{32}$, $D_{2C}$, $D_{18}$, $D_{0A}$, $P_{09}$, $P_{18}$, $D_{97}$, $D_{86}$, ... $D_{20}$. In this situation, there is no protection of the Q-parity symbols by the vertical codes.

Through judicious selection of the generator matrices of the various codes, the codes of the first five columns can be subcodes of the codes of columns 6–13. This means that any correct code word of the former columns would constitute a correct code word of the latter columns, but not the other way round. Naturally, this would mean hardware savings for an encoder, and often, also for a decoder. Furthermore, the generator and parity check matrices of the row (or, if applicable, diagonal) code words could to a large degree correspond, leading to further hardware savings.

The foregoing related to a two-dimensional array, only one dimension thereof having two different degrees of error protection by the first and second codes, respectively. Of course, the layout of the array, even with unchanged parameters can be varied according to need, for example, through swapping of columns, other dimensions, etc. The idea of the invention can be expanded. First, the array can have more than two dimensions, for example three. Second, there may be more than two different degrees of error protection shown along the columns in FIG. 1. Third, there may also be more different degrees of error protection in one or two other dimensions of the array. Further, the block shown as user data in FIG. 1 may have additional internal error protection not shown for brevity, or the arrangement according to FIG. 1 may be a subordinate layer in a higher order error protection organization.

FIG. 2 is a block diagram of an encoding and/or decoding apparatus according to the invention. In its most complicated form it may execute both encoding and decoding. In most practical cases, it would be able to execute only one of the two. Although in that case, the internal constitution of encoder and decoder could be quite different. For reasons of brevity, the set-up has been shown identically, which is not to be construed as a limitation.

First, the use of the apparatus of FIG. 2 as an encoding apparatus is described. The user elements arrive at input 20, accompanied with some kind of bit, symbol and block synchronization. Input unit 22 receives the elements and converts them, if necessary, for storage in input storage device 24. For this object, general control device 30 assigns the necessary storage addresses. The development of the column parity symbols may proceed on the fly by first encoder 26, i.e., the contribution of each user element to the parity symbols of its column is directly accumulated. Input unit 22 signals to general control device 30 when one of the columns of user elements has been completely received, and in consequence, when the associated P-symbols are ready. If all columns have been processed, transition element 28 is activated so that second encoder 32 may likewise produce the row parity-symbols along with storage in the output storage device 34. When all elements, i.e., user elements and column redundant elements, have been processed, and all row redundant elements have been produced, output unit 36 is activated, so that the encoded block may appear at output 38.

If required, the encoders and storage devices may be shared, as long as general control device 30 keeps track of all addresses and operations correctly. The operations as shown may occur along with interleaving or deinterleaving at either the input 20 or the output 38. In another realization, not show explicitly, both row and column parities are generated on-the-fly, together with the reception of the user elements.

Next, use of the apparatus according to FIG. 2 as a decoding apparatus is described. The encoded block of elements arrives on input 20, accompanied with some bit, symbol and block synchronization. Input unit 22 receives the elements and converts them, if necessary, for storage in input storage device 24. Such conversion does not influence the information content of the elements, although it may change their representation. For correct storage, general control device 30 assigns the necessary storage addresses. The development of the row syndrome symbols may proceed on the fly by first decoder 26, i.e., the contribution of each user element to the syndrome of its row is directly accumulated. Input unit 22 signals to general control device 30 when one of the rows of user elements has been completely received, and, as a result, when the decoding of the word in question may proceed. The result of decoding may be either "no error", "error corrected" or "error present, but not corrected", taking into account the adopted strategy for error correction. Each of the latter two cases may imply putting flags on all or particular ones of the symbols of the word in question, as has been disclosed in the art, but which is not described here for reasons of brevity. If all rows have been processed, first decoder 26 at its output produces an enabling signal to general control device 30, so that it may activate transition element 28 for transferring the symbols present in input storage device 24 to output storage 34 column-by-column so that second decoder 32 may now likewise produce the column syndrome symbols along with the storage in the output storage device 34.

Another solution is that the column syndromes are generated together with the row syndromes at the input side. This would then require updating of the column syndromes together with any occurring correction storage device 34. When all elements of a column have been processed, the syndrome symbols, and as the case may be, any flag produced in the first stage, are used for decoding the column in question. As before, the result may be "no error", "error corrected" or "error present, but not corrected". In the latter case, it has been known in the art to activate the row decoding once more, but this refinement is foregone for reasons of brevity. When the whole block has been decoded, output unit 36 is activated, so that the decoded block may appear at output 38.

If required, the decoders and storage devices may be shared, as long as general control device 30 keeps track of all addresses and operations correctly. The operations as shown may occur along with interleaving or deinterleaving at either the input 20 or the output 38.

What is claimed is:

1. A method for encoding digital data elements of a uniform size with at least two different degrees of error protection in a data block in accordance with a quasi-product code, the method comprising:

receiving the data elements at an input of an encoding device;

encoding the data elements in the data block by performing the following within the encoding device:

distributing the data elements upon receipt over an array of at least two dimensions, made up of lines in each of the at least two dimensions, so that at least two lines in a first one of the dimensions have a different number of data elements therein;

supplementing the data elements in the first one of the dimensions with first redundant elements of the uniform size in accordance with one or more first systematic codes so that all lines in that dimension containing one or more data elements therein have the same number of elements therein and each of those lines contains at least one separate first redundant element therein, the at least one separate first redundant element in each line in the first one of the dimensions containing one or more data elements therein providing error protection to the one or more data elements contained in that line; and supplementing the data elements and the first redundant elements in a second one of the dimensions with second redundant elements of the uniform size in accordance with one or more second systematic codes so that all lines in that dimension containing one or more data elements and/or first redundant elements therein have the same number of elements therein and each of those lines contains at least one separate second redundant element therein, the at least one separate second redundant element in each line in the second one of the dimensions containing one or more data elements and/or first redundant elements therein providing error protection to the one or more data elements and/or first redundant elements contained in that line; and outputting the data block at an output of the encoding device.

2. The method as claimed in claim 1, wherein in supplementing the at least two lines in the first one of the dimensions which have a different number of data elements therein with first redundant elements, each of those at least two lines receives a different number of first redundant elements, resulting in a first one of those at least two lines having a higher degree of error protection than a second one of those at least two lines.

3. The method as claimed in claim 2, wherein the higher degree of error protection is realized though a greater minimum distance.

4. The method as claimed in claim 2, wherein the first one of those at least two lines is supplemented in accordance with a first first systematic code, and the second one of those at least two lines is supplemented in accordance with a second first systematic code, where the first first systematic code is a subcode of the second first systematic code.

5. The method as claimed in claim 1, wherein the data elements are supplemented by the first and second redundant elements in a manner whereby the first redundant elements provide error protection to certain of the second redundant elements.

6. The method as claimed in claim 1, wherein the data elements in the first one of the dimensions are supplemented with the first redundant elements in accordance with two systematic codes, and the data elements and the first redundant elements in the second one of the dimensions are supplemented with the second redundant elements in accordance with one systematic code.

7. The method as claimed in claim 1, wherein the one or more first and second systematic codes are Reed-Solomon codes.

8. An apparatus for encoding digital data elements of a uniform size with at least two different degrees of error protection in a data block in accordance with a quasi-product code, the device comprising:

distribution means for distributing the data elements over an array of at least two dimensions, made up of lines in each of the at least two dimensions, so that at least two lines in a first one of the dimensions have a different number of data elements therein;

first encoding means for supplementing the data elements in the first one of the dimensions with first redundant elements of the uniform size in accordance with one or more first systematic codes so that all lines in that dimension containing one or more data elements therein have the same number of elements therein and each of those lines contains at least one separate first redundant element therein, the at least one separate first redundant element in each line in the first one of the dimensions containing one or more data elements therein providing error protection to the one or more data elements contained in that line; and second encoding means for supplementing the data elements and the first redundant elements in a second one of the dimensions with second redundant elements of the uniform size in accordance with one or more second systematic codes so that all lines in that dimension containing one or more data elements and/or first redundant elements therein have the same number of elements therein and each of those lines contains at east one separate second redundant element therein, the at least one separate second redundant element in each line in the second one of the dimensions containing one or more data elements and/or first redundant elements therein providing error protection to the one or more data elements and/or first redundant elements contained in that line.

9. The apparatus as claimed in claim 8, wherein the one or more first and second systematic codes are Reed-Solomon codes.

10. A method for decoding digital data elements of a uniform size encoded with at least two different degrees of error protection in a data block in accordance with a quasi-product code by having been (a) distributed over an array of at least two dimensions, made up of lines in each of the at least two dimensions, so that at least two lines in a first one of the dimensions have a different number of data elements therein, (b) supplemented in the first one of the dimensions with first redundant elements of the uniform size in accordance with one or more first systematic codes so that all lines in that dimension containing one or more data elements therein have the same number of elements therein and each of those lines contains at least one separate first redundant element therein and (c) supplemented, together with the first redundant elements, in a second one of the dimensions with second redundant elements of the uniform size in accordance with one or more second systematic codes so that all lines in that dimension containing one or more data elements and/or first redundant elements therein have the same number of elements therein and each of those lines contains at least one separate second redundant element therein, the method comprising:

receiving the data block at an input of a decoding device;

decoding the data elements from the data block by performing the following within the decoding device:
        decoding the lines in the first one of the dimensions; and
        decoding the lines in the second one of the dimensions; and outputting the data elements at an output of the decoding device.

11. The method as claimed in claim 10, wherein all of the lines in the second one of the dimensions are decoded before any of the lines in the first one of the dimensions are decoded.

12. An apparatus for decoding digital data elements of a uniform size encoded with at least two different degrees of error protection in a data block in accordance with a quasi-product code by having been (a) distributed over an array of at least two dimensions, made up of lines in each of the at least two dimensions, so that at least two lines in a first one of the dimensions have a different number of data elements therein, (b) supplemented in the first one of the dimensions with first redundant elements of the uniform size in accordance with one or more first systematic codes so that all lines in that dimension containing one or more data elements therein have the same number of elements therein and each of those lines contains at least one separate first redundant element therein and (c) supplemented, together with the first redundant elements, in a second one of the dimensions with second redundant elements of the uniform size in accordance with one or more second systematic codes so that all lines in that dimension containing one or more data elements and/or first redundant elements therein have the same number of elements therein and each of those lines contains at least one separate second redundant element therein, the device comprising:

first decoding means for decoding the lines in the first one of the dimensions; and second decoding means for decoding the lines in the second one of the dimensions.

13. The apparatus as claimed in claim 12, further comprising enabling means, coupled between said first and second decoding means, for generating an enabling signal which enables said first decoding means to decode the lines in the first one of the dimensions after said second decoding means has completed decoding all of the lines in the second one of the dimensions.

* * * * *